United States Patent
Barth et al.

(10) Patent No.: US 9,419,190 B2
(45) Date of Patent: Aug. 16, 2016

(54) POTTED OPTOELECTRONIC MODULE HAVING A PLURALITY OF SEMICONDUCTOR COMPONENTS AND METHOD FOR PRODUCING AN OPTOELECTRONIC MODULE

(75) Inventors: Andreas Barth, Schnaittach (DE); Peter Brick, Regensburg (DE); Michael Wittmann, Alteglofsheim (DE)

(73) Assignee: OSRAM GmbH, Munich (DE)

( * ) Notice: Subject to any disclaimer, the term of this patent is extended or adjusted under 35 U.S.C. 154(b) by 244 days.

(21) Appl. No.: 13/393,820

(22) PCT Filed: Aug. 25, 2010

(86) PCT No.: PCT/EP2010/062400
§ 371 (c)(1),
(2), (4) Date: Mar. 1, 2012

(87) PCT Pub. No.: WO2011/026768
PCT Pub. Date: Mar. 10, 2011

(65) Prior Publication Data
US 2012/0168786 A1    Jul. 5, 2012

(30) Foreign Application Priority Data
Sep. 3, 2009   (DE) .................. 10 2009 039 982

(51) Int. Cl.
| H01L 33/50 | (2010.01) |
| H01L 33/52 | (2010.01) |
| H01L 33/54 | (2010.01) |
| H01L 25/075 | (2006.01) |

(52) U.S. Cl.
CPC ............ *H01L 33/54* (2013.01); *H01L 25/0753* (2013.01); *H01L 2924/0002* (2013.01)

(58) Field of Classification Search
USPC ........................................... 257/89
See application file for complete search history.

(56) References Cited

U.S. PATENT DOCUMENTS

| 2004/0041521 A1* | 3/2004 | Mandler et al. ............... 313/512 |
| 2006/0132725 A1* | 6/2006 | Terada et al. ................. 353/102 |
| 2006/0138436 A1* | 6/2006 | Chen et al. ..................... 257/98 |
| 2007/0217209 A1 | 9/2007 | Wong |

FOREIGN PATENT DOCUMENTS

| DE | 296 16 286 | 3/1997 |
| DE | 10 2006 048 592 | 4/2008 |
| DE | 10 2008 054 050 | 5/2010 |
| EP | 1 978 301 | 8/2006 |
| EP | 2 088 362 | 10/2007 |
| JP | 2001-196637 | 7/2001 |
| JP | 2007-329249 | 12/2007 |
| JP | 2008 135381 | 6/2008 |
| JP | 2009 218091 | 9/2009 |
| WO | WO 2007/080803 | 7/2007 |
| WO | WO 2009/081382 | 7/2009 |

* cited by examiner

*Primary Examiner* — Asok K Sarkar
*Assistant Examiner* — Dmitriy Yemelyanov
(74) *Attorney, Agent, or Firm* — Cozen O'Connor

(57) ABSTRACT

An optoelectronic semiconductor component comprising: a main body (100) having a recess; (102), a first optoelectronic element (104) and a second optoelectronic element; (106) a surface structured element; (110) and a filling compound (112) embedding the first optoelectronic element (104) and the second optoelectronic element (106) in the recess, wherein the surface structured element configures a surface of the filling compound (112) such that at least two domed regions (114, 116, 118) of the surface are formed.

13 Claims, 5 Drawing Sheets

POTTED OPTOELECTRONIC MODULE HAVING A PLURALITY OF SEMICONDUCTOR COMPONENTS AND METHOD FOR PRODUCING AN OPTOELECTRONIC MODULE

RELATED APPLICATIONS

This is a U.S. national stage of application No. PCT/EP2010/062400, filed Aug. 25, 2010.

This application claims the priority of German application No. 10 2009 039 982.8 filed Sep. 3, 2009, the entire content of which is hereby incorporated by reference.

FIELD OF THE INVENTION

The present invention relates to an optoelectronic semiconductor component, in particular an optoelectronic semiconductor component having a main body which comprises a recess in which a first optoelectronic element and a second optoelectronic element are arranged, and to a method for producing an optoelectronic semiconductor component.

BACKGROUND OF THE INVENTION

One example of such an optoelectronic semiconductor component is a module in which a plurality of optoelectronic elements, by way of example light-emitting diodes, is combined in a housing as isolated semiconductor chips. The optoelectronic elements are arranged in a recess of a main body and potted with a potting compound. That the main radiation directions of the diodes introduced into the housing are slightly different from each other is often a problem in this connection. There are visible color differences in the far field in large angular ranges, in particular in the case of multi-color LEDs, because, when viewed from different angles, the light emission of individual diodes is evident to different degrees. An amount of light that is constant for each diode, which, by way of example, is necessary for the generation of white light by light mixing, does not pass into all angular ranges. These color differences are undesirable in typical applications, such as large video walls or projectors.

SUMMARY OF THE INVENTION

One object of the present invention is to provide an optoelectronic semiconductor component with which the above-described effect can be reduced.

Various embodiments of the optoelectronic semiconductor component comprise a main body having a recess. They each comprise a first optoelectronic element, a second optoelectronic element and a surface structured element. The first optoelectronic element and the second optoelectronic are embedded into the recess by a filling compound. The surface structured element configures a surface of the filling compound such that at least two domed regions of the surface are formed.

Various embodiments of the method for producing an optoelectronic semiconductor components comprise the following steps:
providing a main body having a recess and a surface structured element,
arranging a first optoelectronic element and a second optoelectronic element in the recess, and
filling the recess with a filling compound, wherein at least two domed regions of a surface of the filling compound are formed by the surface structured element.

It is a basic idea of various embodiments that an optoelectronic component is provided which comprises at least two optoelectronic elements, such as light-emitting diodes. The optoelectronic elements are enclosed by a filling material which is typically transparent. The filling material has a surface across which radiation, which is emitted by the optoelectronic elements, is decoupled. By providing surface structured elements, the surface is divided into two regions which are each domed. A surface can be produced thereby in which the surface has approximately the same configuration from the perspective of the individual optoelectronic elements. The individual optoelectronic elements therefore each radiate comparably in all directions. Improved color homogeneity in particular is achieved in large angular ranges of the optoelectronic semiconductor component. This is particularly advantageous if the optoelectronic semiconductor component is configured for producing white light from the overlaying of radiation emitted by the optoelectronic elements, with each of the optoelectronic elements emitting on a different color spectrum. Color differences can be reduced thereby in typical applications, such as video walls or projectors.

In one embodiment of the optoelectronic semiconductor component the surface structured element is formed by a protrusion of the main body extending into the recess. This produces a constriction in the recess. When the recess is filled with filling compound a structuring of the surface of the filling compound forms in two regions, each with a domed surface profile, owing to the surface tension of the filling compound at the constriction. The surface of the filling compound is thus divided into two regions owing to the provision of the protrusion.

In one embodiment of the optoelectronic semiconductor component the surface structured element is formed by a web running in the recess. A contact tension is produced on the web between the filling compound and the web material. Regions of the surface, which are domed owing to the surface tension, therefore form on both sides respectively. The web is, by way of example, in contact with the surface, so the curve and alignment of the dome is influenced by the height of the web.

In one embodiment of the optoelectronic semiconductor component the surface structured element is bridge-shaped in the recess. The beam path of the radiation emitted by the optoelectronic element is minimally affected as a result.

In one embodiment of the optoelectronic semiconductor component the two domed regions are each domed so as to be concave. Particularly good color fidelity of the overlaid spectra over a large solid angle is achieved by the path of the rays of the radiation, emitted by the optoelectronic elements, affected in this way.

In one embodiment of the optoelectronic semiconductor component the first optoelectronic element and the second optoelectronic element are each designed as radiation sources. Spectra in both the non-visible range and in the range of visible light are conceivable in this connection.

In one embodiment of the optoelectronic semiconductor element the first optoelectronic element has a different emission spectrum to the second optoelectronic element. Different color spectra of the radiation emitted by the optoelectronic semiconductor component as a whole are achieved by overlaying the respective spectra of the optoelectronic elements.

In one embodiment of the optoelectronic semiconductor component the filling compound is a potting compound. Consequently particularly simple production of the optoelectronic semiconductor component may be achieved. Furthermore, after potting, the optoelectronic elements are enclosed by the filling compound without particular contact faces.

In one embodiment of the optoelectronic semiconductor component the potting compound comprises one of the following materials:
epoxy resin,
acrylic resin,
silicone, and
silicone resin.

These materials are distinguished in particular by their transparency in the range of visible light as well as by straightforward workability when producing the optoelectronic semiconductor component. A hybrid based on one or more of the above-mentioned materials, or an appropriate blend, is also suitable as a potting compound.

In one embodiment of the method for producing an optoelectronic semiconductor component the surface of the filling compound is cured. The surface structure of the filling compound formed by the surface structured element is permanently solidified as a result.

In one embodiment of the method for producing an optoelectronic semiconductor component the filling compound is cured by way of cooling or a glass transition.

In one embodiment of the method for producing an optoelectronic semiconductor component the filling compound is introduced into the embodiment by potting.

BRIEF DESCRIPTION OF THE DRAWINGS

Various exemplary embodiments of the inventive solution will be described in more detail below with reference to the drawings.

In the figures the first number(s) of a reference character indicate the figure in which the reference character is first used. The same reference characters are used in all figures for identical elements or elements or properties with the same action. In the drawings.

DETAILED DESCRIPTION OF THE DRAWINGS

Figure 1A:
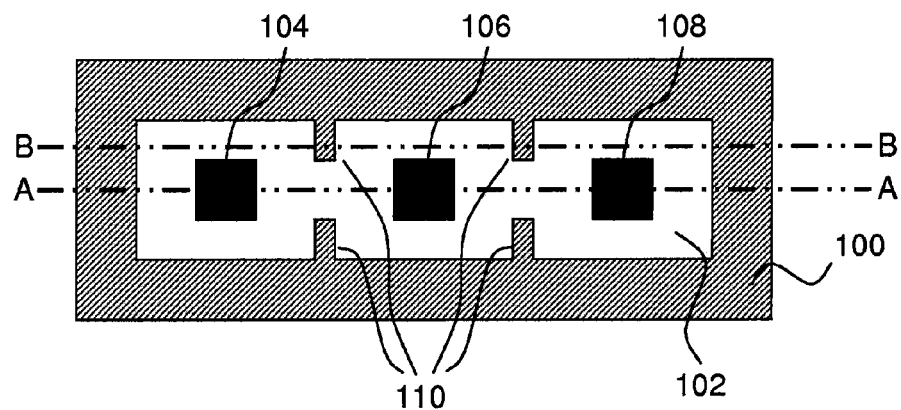
FIG. 1a shows a schematic diagram of a view of an optoelectronic semiconductor component according to a first exemplary embodiment.

FIG. 1a shows a schematic diagram of a view of a first exemplary embodiment of an optoelectronic semiconductor component. The optoelectronic semiconductor component comprises a main body 100. A recess 102 is provided in the main body 100. A first optoelectronic element 104, a second optoelectronic element 106 and a third optoelectronic element 108 are arranged in the recess 102. The main body 100 comprises protrusions 110 which extend in the recess 102 and form constrictions therein. A filling compound is introduced into the recess 102 and embeds the first optoelectronic element 104, the second optoelectronic element 106 and the third optoelectronic element 108 and covers them.

The main body 100 corresponds to a support for the optoelectronic elements with a housing to protect them. The main body 100 can be designed in one piece or in multiple pieces. By way of example, the main body 100 is formed by overmolding a support or a leadframe with a plastics material.

The materials for the main body can be chosen from a large number of suitable materials known from semiconductor manufacture. A temperature range for an operating temperature of the optoelectronic semiconductor component by way of example can be taken into account. Suitable materials with a high reflection coefficient can be chosen by way of example. The radiation output of the optoelectronic semiconductor component, by way of example, can be increased thereby. For this purpose the main body 100 can comprise, by way of example, a support, which carries a reflector, in which the recess 102 is located. It is conceivable for the main body 100 or parts of the main body to be produced by an injection molding method.

The main body 100 can be made of any suitable material. An absorbent part of the main body 100, by way of example a black housing, is conceivable instead of a reflector. A significant improvement in the color homogeneity can be achieved by way of the described arrangement in the case of an absorbent part, in which more pronounced color inhomogeneities occur due to the lack of scattering on the housing material.

The recess 102 can be formed as an opening in the main body 100. It can, by way of example, be formed as early as during formation of the main body 100 or be subsequently constructed in the main body 100. The recess 102 can have smooth inner faces. It is possible that the inner faces are structured, by way of example to achieve better radiation output of the optoelectronic semiconductor component. The lateral inner faces can be formed perpendicularly in the main body 100. It is also possible for the lateral inner faces to be inclined, by way of example in that they are formed in such a way that the recess 102 spreads toward the opening. The demolding inclines thus formed have, by way of example, an angle of more than 4° from the perpendicular to the base of the recess 102. The radiation output of the optoelectronic semiconductor component is likewise improved thereby.

The first optoelectronic element 104, the second optoelectronic element 106 and the third optoelectronic element 108 are each designed as individual semiconductor chips. An inorganic semiconductor, by way of example a III-V semiconductor, such as a GaAs semiconductor or a GaN semiconductor, as well as an organic semiconductor are conceivable. Epitaxy layers grown on a substrate are possible as semiconductors in this connection. The substrate comprises materials such as SiC, sapphire, Ge, Si, GaAs, GaN or GaP. The epitaxy layers comprise, by way of example, quaternary semiconductors, such as AlInGaN for a blue or green emission spectrum in the visible range or AlInGaP for a red emission spectrum in the visible range. The epitaxy layer can also comprise quinternary semiconductors. A semiconductor of this kind is by way of example AlGaInAsP which can be used for emission of radiation in the infrared range.

The optoelectronic elements are arranged in relation to an optical axis which runs as a normal through an opening area of the recess 102, so the optoelectronic elements emit radiation substantially through the opening in the recess. The optoelectronic elements can be optical sensors as well as primarily radiation sources. Both light-emitting diodes as well as organic light-emitting diodes can be considered.

The protrusions 110 project from the main body into the recess 102. They can be made of the same material as the main body and be manufactured in one piece therewith. A injection molding method of at least the entire internal geometry of the recess 102 is conceivable. A suitable design of a mold core for a tool is conceivable owing to the geometry. It is also conceivable for the protrusion to be provided on the main body and/or is made of a different material. Each of the protrusions 110 can extend over the entire depth of a respective lateral inner face of the recess 110 or over only a portion thereof. Any variation with respect to design and arrangement of the protrusions is conceivable if a surface of the filling compound is structured by them.

The protrusions 110 can have different sizes. The constrictions in the recess 102 formed by the protrusions 110 have widths of more than 100 μm in some exemplary embodiments.

The filling compound is a transparent material which is used for enclosing the optoelectronic elements. A transparent material can be used as the filling material which has UV-initiated or light-initiated, cationically curing properties. A silicone or an epoxy resin by way of example may be considered for the filling compound. Acrylic resins, such as PMMA, or silicone resins, may also be used. The filling compound can also contain a diffuser material to allow a diffuse radiation decoupling of radiation produced in the optical elements. For this purpose the filling compound can contain diffuser particles which are distributed in the filling compound. They are used to diffusely scatter radiation which strikes it, such as light. The distribution of the diffuser particles can be as uniform as possible. However, by way of suitable productions processes it is also conceivable to select the distribution of the diffuser particles in such a way that particular optical properties of the filling compound are achieved. Both the absorption properties and the diffusion properties of the filling compound are affected by the proportion of diffuser particles therein. The proportion of diffuser particles in the filling compound is, by way of example, between about 0.15% and about 2.0%. However, it may be chosen so as to be higher or lower in accordance with the desired optical properties of the filling compound. The use of diffuser particles is known by way of example from document [1] whose disclosure is hereby incorporated by reference in the present document.

The filling compound can also contain absorber materials to influence the optical properties of the optoelectronic semiconductor component as required.

Figure 1B:
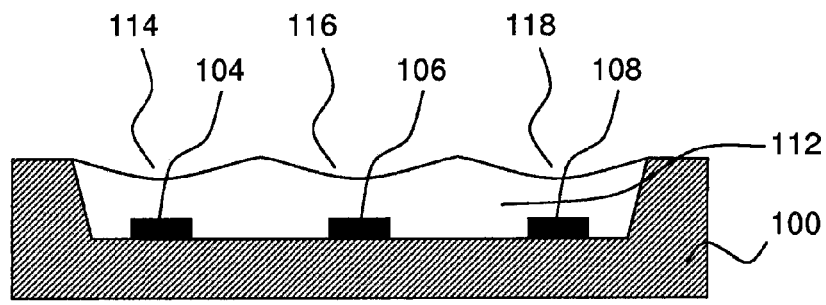
FIG. 1b shows a schematic diagram of a cross-section through the optoelectronic semiconductor component shown in FIG. 1a along a cutting axis A-A.

The structure of the first exemplary embodiment of the optoelectronic semiconductor component will become clearer with reference to FIG. 1b. FIG. 1b shows the schematic diagram of a cross-section through the optoelectronic semiconductor component shown in FIG. 1a along a cutting axis A-A. The first optoelectronic element 104, the second optoelectronic element 106 and the third optoelectronic element 108 are arranged on a bottom of the recess in the main body 100. The recess is filled with the filling compound 112, so the optoelectronic elements are embedded. The filling compound 112 has a surface which opposes the bottom of the recess. The surface is structured by the protrusions into a first region 114, a second region 116 and a third region 118. The regions thereby form local blank molds on the light exit side for each one of the optoelectronic elements.

The local blank molds are produced inter alia when the filling compound 112 is introduced into the recess. The molds are, by way of example, as a function of the surface tension of the filling compound 112 in the liquid phase, the free surface energy of the material such that the contact surface between filling compound and main body 100 forms and the interfacial surface tension on this contact face. By suitable choice of material and/or processing the physical parameters can be adjusted in such a way that a suitable local blank mold is produced. As illustrated, the surface can be formed into three concave regions. However, it is also conceivable for these regions to be domed in some other way. Convex doming of the surface by way of example is conceivable. It is also conceivable for the regions to comprise local domes in the surface that are different from each other in that the first region 114 is domed so as to be convex and the second region 116 is domed so as to be concave.

FIG. is shows a schematic diagram of a cross-section through a first embodiment of the optoelectronic semiconductor component shown in FIG. 1a along a cutting axis B-B. This cutting axis B-B runs parallel and offset to the cutting axis A-A in FIG. 1b.

The main body 100, which comprises two protrusions 110, is shown. The protrusions 110 have the same height as the recess in the main body 100. The recess is filled with the filling compound 102. This wets the side walls of the protrusions 110. The surface of the filling compound 102 is divided by the protrusions 110 into a first region 114, a second region 116 and a third region 118. Due to the wetting the side walls of the protrusions 110 and the inner walls of the main body 100 facing the recess, as well as the surface tension of the filling compound 102, the regions each have a domed shape. The dome is determined as illustrated in relation to FIG. 1b. It is reproduced purely by way of example in both FIG. 1b and FIG. 1c.

Figure 1C:
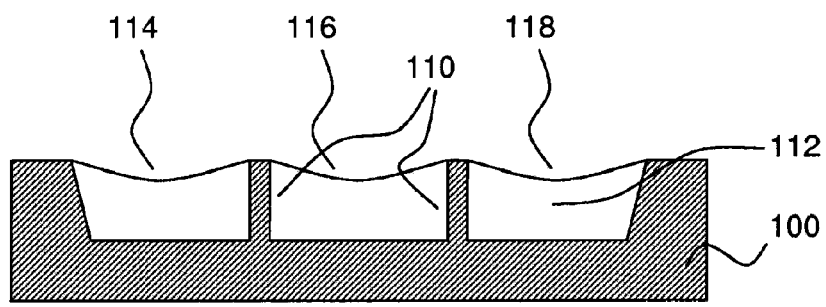
FIG. 1c shows a schematic diagram of a cross-section through a first embodiment of the optoelectronic semiconductor component shown in FIG. 1a along a cutting axis B-B.
Figure 1D:
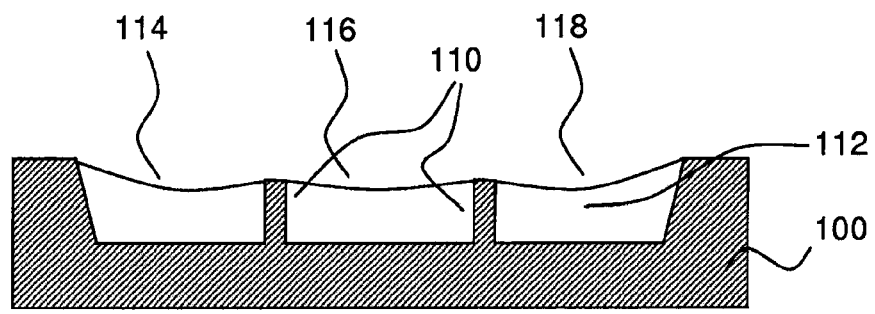
FIG. 1d shows a schematic diagram of a cross-section through a second embodiment of the optoelectronic semiconductor component shown in FIG. 1a along a cutting axis B-B.

FIG. 1d shows a schematic diagram of a cross-section through a second embodiment of the optoelectronic semiconductor component shown in FIG. 1a along a cutting axis B-B.

The second embodiment in FIG. 1d differs from the first embodiment in FIG. 1c in that the protrusions 110 have a lower height than the recess in the main body 100. Lower filling levels by way of example would be possible as a result. It is possible to configure the shaping of the regions of the surface of the filling compound 112 by the height of the protrusions 110.

It is also conceivable for the shaping of the region of the surface of the filling compound 112 to be influenced by the position of the protrusions 110 in relation to the arrangement of the optoelectronic elements. This will be described in more detail hereinafter with reference to FIG. 2a.

Figure 2A:
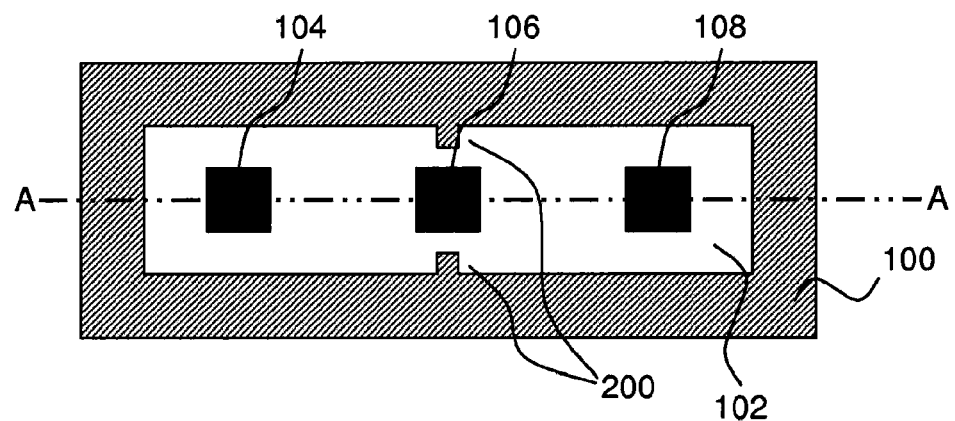
FIG. 2a shows a schematic diagram of a view of an optoelectronic semiconductor component according to a second exemplary embodiment.
Figure 2B:
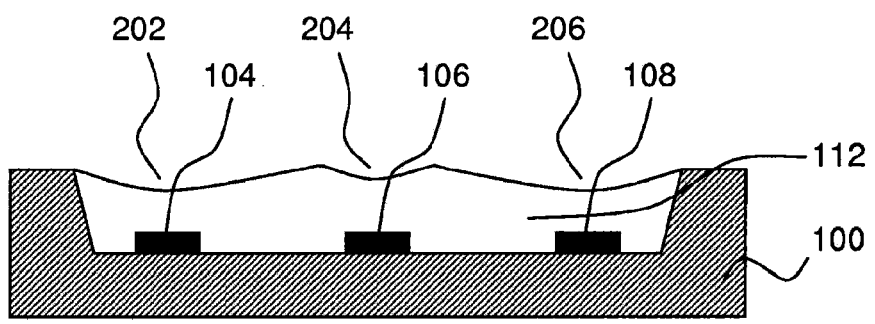
FIG. 2b shows a schematic diagram of a cross-section through the optoelectronic semiconductor component shown in FIG. 2a along a cutting axis A-A.

FIG. 2a shows a schematic diagram of a view of a second exemplary embodiment of an optoelectronic semiconductor component. The second exemplary embodiment has a similar construction to the first exemplary embodiment in FIGS. 1a to 1d. It can be constructed in accordance with the described possible designs and variations. The second exemplary embodiment is distinguished essentially in that protrusions 200 and 202 formed on the main body 100 are provided which are arranged in a line with one of the optoelectronic elements, here with the second optoelectronic element 116. A shaping of the surface of the filling compound that is different from the first exemplary embodiment in FIGS. 1a to 1d is achieved as a result. The shaping is with the aid in FIG. 2b which shows a cross-section of the second exemplary embodiment along a cutting axis A-A. The surface of the filling compound 112 is divided by the provision of the protrusions 200 into a first region 202, a second region 204 and a third region 206. The second region 204 takes up a smaller proportion of the surface than the first region 202 and the third region 206. The regions are domed. Because the second region 204 takes up a smaller proportion of the surface than the two other regions, the radius of curvature of the dome is different from the other regions. It is clear that the structure of the surface of the filling compound can be influenced by the positioning and thickness of the protrusions.

Figure 3A:
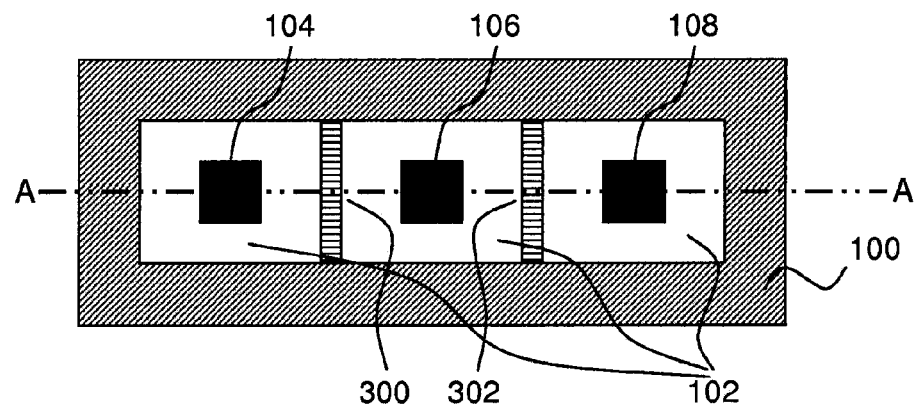
FIG. 3a shows a schematic diagram of a view of an optoelectronic semiconductor component according to a third exemplary embodiment.
Figure 3B:
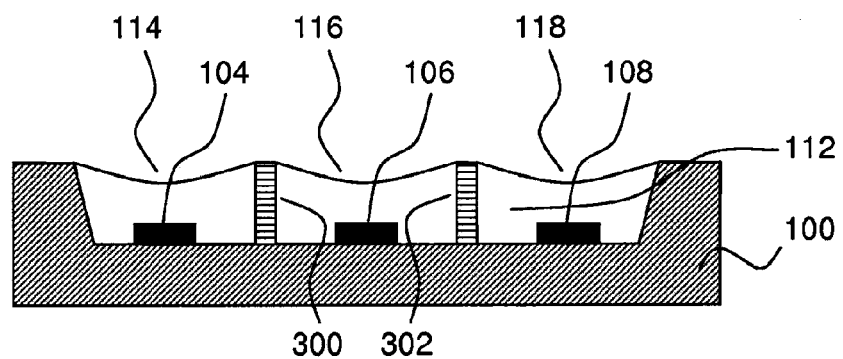
FIG. 3b shows a schematic diagram of a cross-section through the optoelectronic semiconductor component shown in FIG. 3a along a cutting axis A-A.

FIG. 3a shows a schematic diagram of a view of a third exemplary embodiment of an optoelectronic semiconductor component. The third exemplary embodiment has a construction similar to the first exemplary embodiment in Figures la to ld and to the second exemplary embodiment in FIGS. 2a to 2b. It can be constructed in accordance with the described possible designs and variations of the first exemplary embodiment and the second exemplary embodiment. The second exemplary embodiment differs essentially in that the first web 300 formed on the main body 100 and the second web 302, also formed on the main body, extend through the recess 102. The first web 300 is arranged between the first optoelectronic element 104 and the second optoelectronic element 106. The second web 302 is arranged between the second optoelectronic element 106 and the third optoelectronic element 108. The recess 102 is divided into three regions as a result. The surface of the filling compound is consequently also divided into a first region 114, a second region 116 and a third region 118, as shown in FIG. 3b.

Figure 3C:
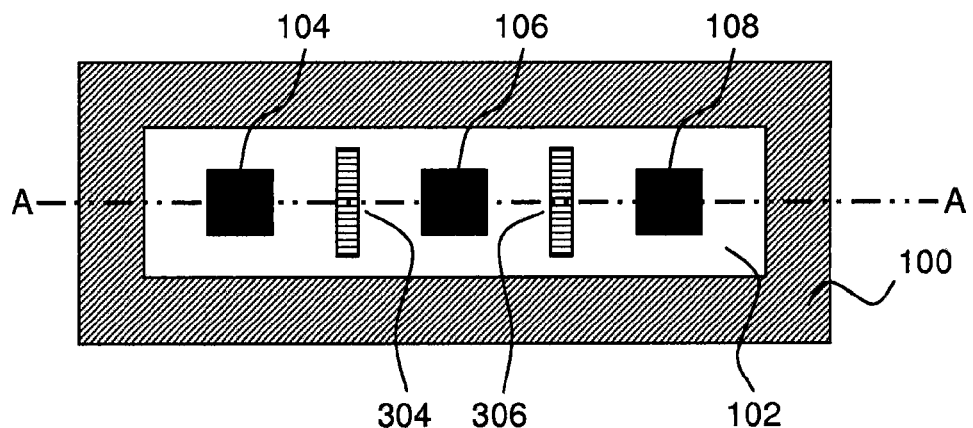
FIG. 3c shows a schematic diagram of a view of an optoelectronic semiconductor component according to a design of the third exemplary embodiment.

A particular design is shown with reference to FIG. 3c. The embodiment differs from the embodiment in FIG. 3a and FIG. 3b in that it comprises a third web 304 and a fourth web 306 instead of the first web 300 and the second web 302. The third web 304 and the fourth web 306 are distinguished in that they are not connected to the lateral inner faces of the recess but to a base of the recess, and are supported thereby. The third web 304 and the fourth web 306 extend through part of the recess 102. They are in at least partial contact with the base of the recess 102 and are thus supported. The recess can be filled with filling compound better during production of the optoelectronic due to the gap that exists between the lateral inner faces and the webs. Different structuring of the surface, and therewith different radiation characteristics of the optoelectronic semiconductor component, can also be achieved due this arrangement.

Figure 4A:
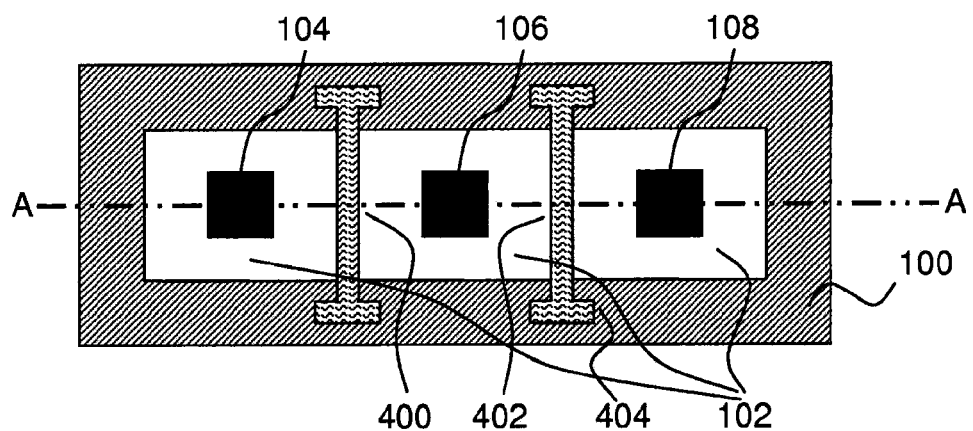
FIG. 4a shows a schematic diagram of a view of an optoelectronic semiconductor component according to a fourth exemplary embodiment.

FIG. 4a shows a schematic diagram of a view of a fourth exemplary embodiment of an optoelectronic semiconductor component. The fourth exemplary embodiment has a construction similar to the first exemplary embodiment in FIGS. 1a to 1d, to the second exemplary embodiment in FIGS. 2a to 2b and to the third exemplary embodiment in FIGS. 3a to 3c. However, it differs therefrom essentially in that a first bridge 400 and a second bridge 402 are provided in the place of a protrusion or a web. The first bridge 400 and the second bridge are secured by respective fixings, by way of example by a fixing 404, to the main body 100. However, they may also be constructed in one piece with the main body 100. The first bridge 400 and the second bridge 402 run on the surface of the filling material.

Figure 4B:
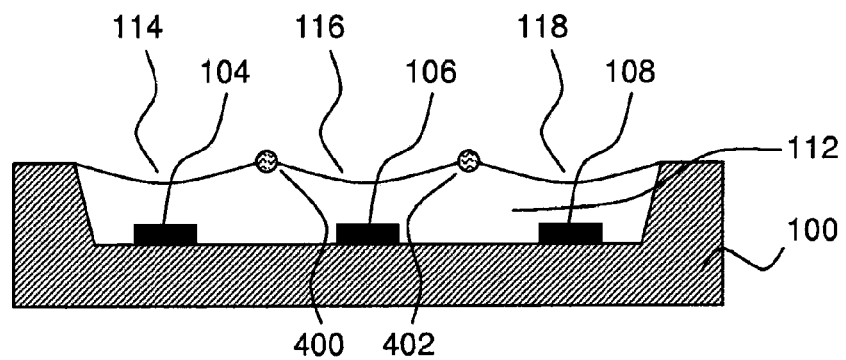
FIG. 4b shows a schematic diagram of a cross-section through the optoelectronic semiconductor component shown in FIG. 4a along a cutting axis A-A.

This is illustrated for the purpose of clarification in FIG. 4b which shows a schematic diagram of a cross-section through the optoelectronic semiconductor component shown in FIG. 4a along a cutting axis A-A.

The first bridge 400 and the second bridge 402 can be made from different materials. It is conceivable for them to contain materials which are present in the main body. In one possible embodiment the bridges comprise fibers which ideally are transparent in the spectrum of the radiation emitted by the optoelectronic elements. Thin glass fibers can preferably be used. The contact tension with the surface of the filling compound, and therewith the dome of the regions on the surface of the filling compound, can be influenced by a suitable choice of material.

Even if all exemplary embodiments in FIG. 1a to FIG. 4b have been described in connection with three optoelectronic elements, any other number of optoelectronic elements is still conceivable provided there are at least two optoelectronic elements present. Three optoelectronic elements allow, by way of example, an optoelectronic semiconductor component in whose spectra the colors red, blue and green exist. It is also conceivable to provide four optoelectronic elements in order, by way of example, by providing two optoelectronic elements, which primarily radiate in a green spectrum, to provide an optoelectronic semiconductor component which radiates a white overlaid spectrum. Such a spectrum is very close to the spectrum of solar radiation. Both the radiation intensity and the color temperature of the radiated light may be adjusted as required by the number and choice of optoelectronic elements.

Figure 5:
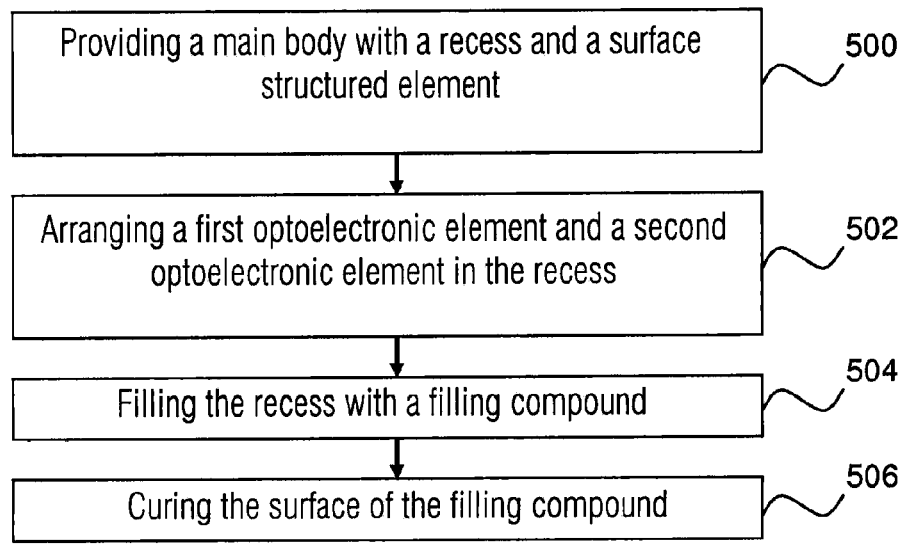
FIG. 5 shows a flow diagram of an exemplary embodiment of a method for producing an optoelectronic semiconductor component.

Exemplary Embodiments of the Method for Producing an Optoelectronic Semiconductor Component FIG. 5 shows the flow diagram of an exemplary embodiment of a method for producing an optoelectronic semiconductor component.

A main body having a recess and a surface structured element is provided in a first step 500. The main body is a support for the optoelectronic elements, having a housing for protecting the same, as is described in relation to the exemplary embodiments in FIG. 1a to FIG. 4b. The recess is provided in the main body. It may be produced when the main body is being created, by way of example, in that a corresponding housing is provided on the support, or in that the recess is produced in the main body by appropriate processing, by way of example an etching process. The surface structured element is provided on the main body. Its function and design correspond to the surface structured element, as is described in relation to the exemplary embodiments in FIG. 1a to FIG. 4b. The surface structured element can be provided or formed when the main body is created or subsequently.

In a second step 502 a first optoelectronic element and a second optoelectronic element are arranged in the recess. The first optoelectronic element and the second optoelectronic element are each designed as individual semiconductor chips. Both an inorganic semiconductor, by way of example a III-V semiconductor, such as a GaAs semiconductor, and an organic semiconductor are conceivable. They can be arranged in the recess as or as bare semiconductor chips. It is conceivable for a luminescence conversion layer to be applied to the active side of one or more semiconductor chip(s). Some of the primary radiation emitted by the semiconductor chips is converted in the luminescence conversion layer into radiation of a different wavelength. As a rule it comprises a radiation-permeable matrix material and a fluorescent material introduced into the matrix material. The fluorescent material introduced into the matrix material absorbs at least some of the radiation emitted by the semiconductor chips and emits radiation in a different wavelength range. Inorganic fluorescent materials by way of example are used as fluorescent materials, such as garnets doped with rare earths. Organic fluorescent materials, such as perylene or blends of different fluorescent materials may also be used. A large number of possible fluorescent materials is known from document [2] whose disclosure is hereby incorporated by reference in the present document. The optoelectronic elements are arranged in relation to an optical axis, which runs as a normal through the opening in the recess, so the optoelectronic elements emit radiation substantially through the opening in the recess.

In a third step 504 the recess is filled with a filling compound. The filling compound is the filling compound described in relation to the exemplary embodiments in FIG. 1a to FIG. 4b. It is usually an amorphous solid which is introduced into the recess in a liquid phase. The optoelectronic elements are completely covered in the process. A surface of the filling compound is structured into two domed regions owing to the surface tension of the filling compound and the contact tension of the main body and the surface structured element. This structure, and in particular the surface of the filling compound structured into two domed regions, is frozen in a fourth step 506 by solidifying the filling compound, by way of example by curing, cooling or a glass transition.

Concluding Finding

The optoelectronic semiconductor component and the method for producing an optoelectronic semiconductor component have been described with reference to some exemplary embodiments to illustrate the underlying idea. The exemplary embodiments are not limited to certain feature combinations. Even if some features and designs have only been described in connection with a particular exemplary embodiment or individual exemplary embodiments, they may each be combined with other features from other exemplary embodiments. It is also conceivable for individual features or particular designs described in exemplary embodiments to be omitted or added if the general technical teaching is still achieved.

Even if the steps of the method for producing an optoelectronic semiconductor component are described in a certain sequence, it is obvious that any of the methods described in this disclosure can be carried out in any other meaningful sequence, it also be possible to leave out or add method steps provided there is no departure from the basic idea of the described technical teaching.

The invention claimed is:

1. An optoelectronic semiconductor component comprising:
   a main body having a recess, wherein the recess has a bottom and lateral inner faces;
   a first optoelectronic element and a second optoelectronic element arranged in the recess;
   a surface structuring element formed by a protrusion of the main body extending from a lateral inner face partially into the recess, producing a constriction in the recess such that the recess is divided in at least two contiguous regions; and
   a filling compound embedding the first optoelectronic element and the second optoelectronic element in the recess, wherein the filling compound is a potting compound, and
   wherein the surface structuring element configures a surface of the filling compound such that at least two domed concave regions of the surface are formed.

2. The optoelectronic semiconductor component as claimed in claim 1, wherein the constriction in the recess has a width of more than 100μm.

3. The optoelectronic semiconductor component as claimed in claim 1, wherein the constriction is formed by a first protrusion and a second protrusion, wherein the first protrusion extends from a first lateral inner face into the recess and the second protrusion extends from a second lateral inner face into the recess, wherein the first and the second lateral inner faces are arranged opposite to each other.

4. The optoelectronic semiconductor component as claimed in claim 1, wherein at least one surface structuring element structures a continuous surface of the filling compound in at least two regions.

5. The optoelectronic semiconductor component as claimed in claim 1, wherein the first optoelectronic element and the second optoelectronic element are each designed as radiation sources.

6. The optoelectronic semiconductor component as claimed in claim 5, wherein the first optoelectronic element has a different emission spectrum to the second optoelectronic element.

7. The optoelectronic semiconductor component as claimed in claim 1, wherein the potting compound comprises one of the following materials: epoxy, resin, acrylic resin, and silicone resin.

8. The optoelectronic semiconductor component as claimed in claim 1, wherein the filling compound comprises a diffuse material.

9. The optoelectronic semiconductor component as claimed in claim 1, wherein the filling compound comprises an absorber material.

10. An optoelectronic semiconductor component comprising:
    a main body having a recess, wherein the recess has a bottom and lateral inner faces;
    a first optoelectronic element and a second optoelectronic element arranged in the recess;
    a surface structuring element formed by a protrusion of the main body extending from a lateral inner face into the recess at a distance from the bottom of the recess, said surface structuring element having a bridge shaped form; and
    a filling compound embedding the first optoelectronic element and the second optoelectronic element in the recess,
    wherein the filling compound is a potting compound, and
    wherein the surface structuring element configures a surface of the filling compound such that at least two domed concave regions of the surface are formed.

11. The optoelectronic semiconductor component as claimed in claim 10, wherein the bridge shaped structuring element has a circular cross-section.

12. An optoelectronic semiconductor component comprising:
    a main body having a recess, wherein the recess has a bottom and lateral inner faces;
    a first optoelectronic element and a second optoelectronic element arranged in the recess;
    a surface structuring element, wherein the surface structuring element is not connected to the lateral inner faces of the recess; and
    a filling compound embedding the first optoelectronic element and the second optoelectronic element in the recess, wherein the filling compound is a potting compound, and
wherein the surface structuring element configures a surface of the filling compound such that at least two domed concave regions of the surface are formed.

13. The optoelectronic semiconductor component as claimed in claim 12, wherein the surface structuring element is coupled to the bottom of the recess.

* * * * *